(12) United States Patent
Hermanson et al.

(10) Patent No.: US 11,810,754 B2
(45) Date of Patent: Nov. 7, 2023

(54) SYSTEM USING PIXELATED FARADAY SENSOR

(71) Applicant: Applied Materials, Inc., Santa Clara, CA (US)

(72) Inventors: Eric D. Hermanson, Georgetown, MA (US); Nevin Clay, Charlestown, MA (US); Antonella Cucchetti, Manchester by the Sea, MA (US); Philip Layne, Salem, MA (US); Sudhakar Mahalingam, Lexington, MA (US); Michael Simmons, Auston, TX (US)

(73) Assignee: Applied Materials, Inc., Santa Clara, CA (US)

( * ) Notice: Subject to any disclaimer, the term of this patent is extended or adjusted under 35 U.S.C. 154(b) by 40 days.

(21) Appl. No.: 17/546,667

(22) Filed: Dec. 9, 2021

(65) Prior Publication Data

US 2023/0187171 A1 Jun. 15, 2023

(51) Int. Cl.
*H01J 37/304* (2006.01)

(52) U.S. Cl.
CPC ... *H01J 37/3045* (2013.01); *H01J 2237/2446* (2013.01); *H01J 2237/24578* (2013.01)

(58) Field of Classification Search
CPC ............... H01J 37/3045; H01J 37/3171; H01J 2237/2446; H01J 2237/24578; H01J 2237/24535; H01J 2237/24564; H01J 2237/24542; H01J 2237/24521
See application file for complete search history.

(56) References Cited

U.S. PATENT DOCUMENTS

| 8,653,807 | B2 * | 2/2014 | Kopalidis | G01N 27/404 |
| | | | | 324/459 |
| 9,218,938 | B2 * | 12/2015 | Cheng | H01J 37/244 |
| 2004/0262533 | A1 * | 12/2004 | Krueger | H01J 37/244 |
| | | | | 250/397 |
| 2006/0219955 | A1 | 10/2006 | Ray | |

(Continued)

FOREIGN PATENT DOCUMENTS

| JP | 2011-181433 A | 9/2011 |
| JP | 2020198197 A * | 12/2020 |
| KR | 2015-0001606 A | 1/2015 |

OTHER PUBLICATIONS

International Search Report and Written Opinion dated Apr. 4, 2023 in corresponding PCT application No. PCT/US2022/050417.

*Primary Examiner* — David E Smith
(74) *Attorney, Agent, or Firm* — NIELDS, LEMACK & FRAME, LLC

(57) ABSTRACT

A system and method for optimizing a ribbon ion beam in a beam line implantation system is disclosed. The system includes a calibration sensor disposed in the beam line after the mass analyzer. The calibration sensor is able to measure both the total current of the ribbon ion beam, as well as provide information about its vertical position. Information from the calibration sensor can then be utilized by a controller to adjust various parameters to improve the density as well as the vertical position. In some embodiments, the calibration sensor may include a plurality of Faraday sensors, where, both the total current and the vertical position of the ion beam can be determined. Furthermore, the focus of the ion beam can be estimated based on the distribution of the current in the height direction.

18 Claims, 6 Drawing Sheets

(56) References Cited

U.S. PATENT DOCUMENTS

| | | |
|---|---|---|
| 2013/0035897 A1 | 2/2013 | Pandolfi |
| 2015/0311037 A1 | 10/2015 | Kabasawa et al. |
| 2017/0271127 A1* | 9/2017 | Ishibashi ............ H01J 37/3171 |
| 2021/0296078 A1* | 9/2021 | Ishida ............... H01J 37/32614 |

\* cited by examiner

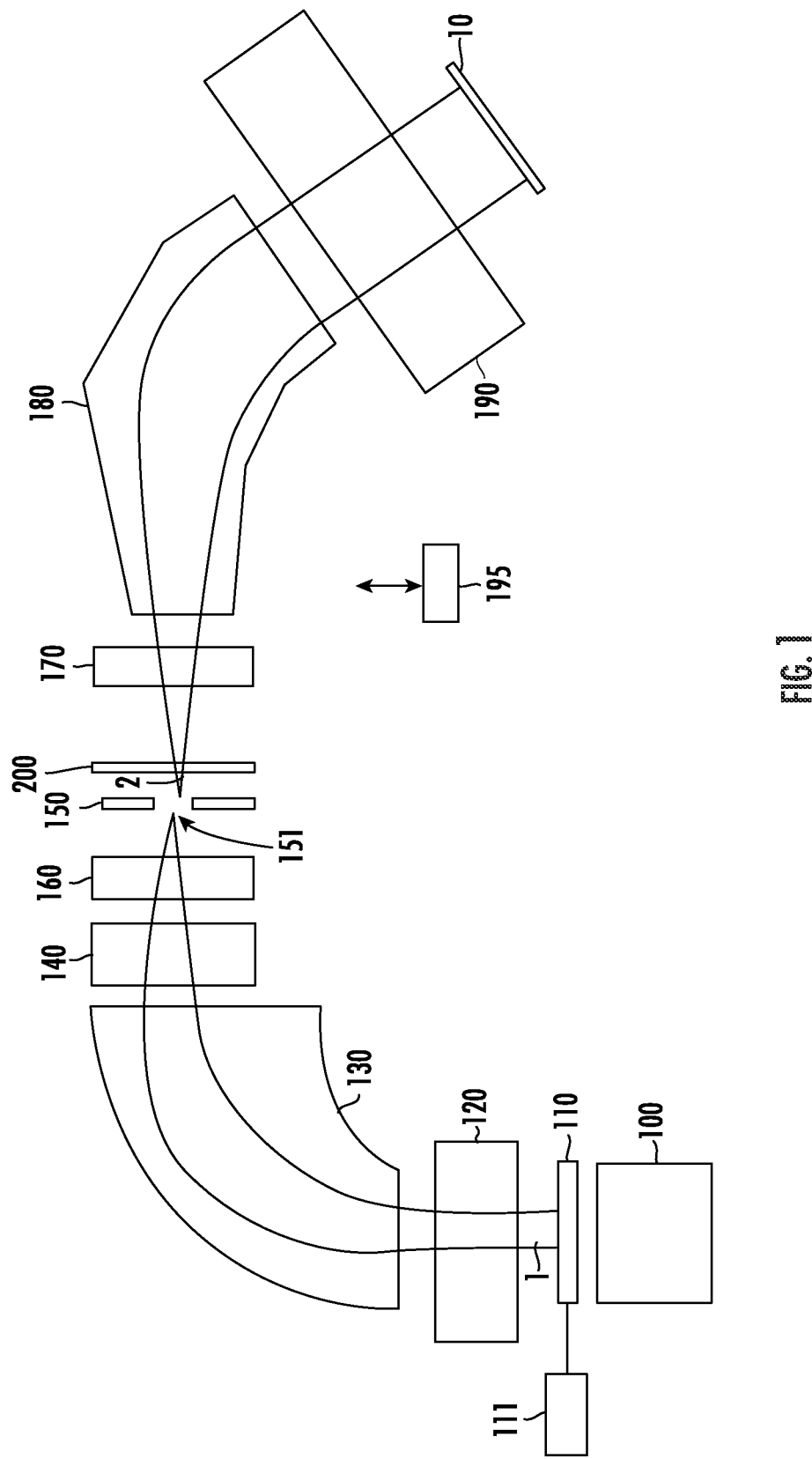

SYSTEM USING PIXELATED FARADAY SENSOR

FIELD

Embodiments of the present disclosure relate to systems and methods for controlling ion beam quality, and more particularly, adjusting the position of the ion beam so that it is centered and focused in the height direction.

BACKGROUND

The fabrication of a semiconductor device involves a plurality of discrete and complex processes. One such process may be an implant process, where a dopant material is implanted into a workpiece.

To direct the ions along the desired path, a beam line system with a plurality of components, such as electrodes, mass analyzers, quadrupole lenses, and acceleration/deceleration stages, may be used. Much like an optics system, the beam line system manipulates the ions by bending the path of the ions and focusing the ions.

In some embodiments, a ribbon ion beam is created. A ribbon ion beam is an ion beam that is much wider than it is tall. Stated differently, the aspect ratio of the ribbon ion beam, which is defined as its width divided by its height, as measured at the workpiece, may be very high, such as greater than 20. In some embodiments, the width of the ribbon beam is wider than the diameter of the workpiece that is being processed.

When a ribbon ion beam is utilized, there are a number of parameters that are of interest. These parameters include the beam current over the region of interest (ROI), the uniformity of the beam current over the ROI, the horizontal angular distribution of ion beamlets in the ribbon ion beam, the horizontal and vertical position of the ribbon ion beam and others.

In some embodiments, the vertical position of the ribbon ion beam as it exits the mass analyzer may affect its shape and density profile at the workpiece.

Therefore, it would be beneficial if there was a system and method for adjusting a ribbon ion beam that allowed the density and position of the ribbon ion beam to be optimized.

SUMMARY

A system and method for optimizing a ribbon ion beam in a beam line implantation system is disclosed. The system includes a calibration sensor disposed in the beam line after the mass analyzer. The calibration sensor is able to measure both the total current of the ribbon ion beam, as well as provide information about its vertical position. Information from the calibration sensor can then be utilized by a controller to adjust various parameters to improve the density as well as the vertical position. In some embodiments, the calibration sensor may include a plurality of Faraday sensors, where, both the total current and the vertical position of the ion beam can be determined. Furthermore, the focus of the ion beam can be estimated based on the distribution of the current in the height direction.

In one embodiment, a beamline ion implantation system is disclosed. The beamline ion implantation system comprises an ion source to generate ions; extraction optics disposed proximate the ion source to extract the ions from the ion source; a mass analyzer to receive the ions from the ion source; a mass resolving device disposed after an output of the mass analyzer; a collimator disposed after the mass resolving device; and a calibration sensor, that is introduced into a path of the ions after the mass resolving device and before the collimator, wherein the calibration sensor is configured to provide information about a total current and a position of the ions in a height direction. In some embodiments, the calibration sensor provides information about a focus of the ions in the height direction. In some embodiments, the calibration sensor provides information about a height of the ions. In some embodiments, the system comprises a controller wherein the controller tunes at least one of the extraction optics and the mass analyzer based on position information from the calibration sensor. In some embodiments, the system comprises at least one quadrupole lens disposed between the ion source and the mass resolving device, wherein the controller tunes the at least one quadrupole lens based on position information from the calibration sensor. In certain embodiments, the calibration sensor comprises an outer Faraday sensor having a slot in a center in the height direction and an inner Faraday sensor disposed behind the slot. In some embodiments, the information about the position of the ions in the height direction comprises a ratio of current collected by the inner Faraday sensor to total current collected by the calibration sensor. In certain embodiments, the calibration sensor comprises a plurality of Faraday sensors stacked in the height direction, wherein an inner Faraday sensor is sandwiched between at least one outer Faraday sensor on each side in the height direction. In some embodiments, the information about the position of the ions in the height direction comprises a ratio of current collected by the inner Faraday sensor to total current collected by the calibration sensor.

In another embodiment, a beamline ion implantation system is disclosed. The beamline ion implantation system comprises an ion source to generate ions; extraction optics disposed proximate the ion source to extract the ions from the ion source; a mass analyzer to receive the ions from the ion source; a mass resolving device disposed after an output of the mass analyzer to create a small beam; a collimator disposed after the mass resolving device; a calibration sensor, that is introduced into a path of the ions after the mass resolving device and before the collimator, wherein the calibration sensor is configured to provide information about a total current and a position of the small beam in a height direction; and a controller, wherein the controller is configured to determine one or more characteristics of the small beam based on information from the calibration sensor, where the one or more characteristics comprise a height of the small beam, a position of the small beam in a height direction and a focus of the small beam. In certain embodiments, the calibration sensor comprises an outer Faraday sensor having a slot in a center in the height direction and an inner Faraday sensor disposed behind the slot. In some embodiments, the controller determines the height of the small beam by moving the extraction optics so that the small beam moves in the height direction, and wherein the height is determined based on positions of the extraction optics at which the inner Faraday sensor collects current. In some embodiments, the controller determines the focus of the ions in the height direction using a ratio of current collected by the inner Faraday sensor to total current collected by the calibration sensor. In certain embodiments, the calibration sensor comprises a plurality of Faraday sensors stacked in the height direction, wherein an inner Faraday sensor is sandwiched between at least one outer Faraday sensor on each side in the height direction. In some embodiments, the controller determines the height of the small beam based on which Faraday sensors collect current. In some embodiments, the controller determines the position of the small beam in the height direction based on which Faraday sensor collect a maximum amount of current. In some embodiments, the controller determines the focus of the small beam in the height direction based on a ratio of current collected by the inner Faraday sensor to a total current collected by the calibration sensor.

According to another embodiment, a calibration sensor is disclosed. The calibration sensor comprises an outer Faraday sensor having a slot in a center in a height direction and an inner Faraday sensor disposed behind the slot.

BRIEF DESCRIPTION OF THE FIGURES

For a better understanding of the present disclosure, reference is made to the accompanying drawings, which are incorporated herein by reference and in which:

FIG. 1 is a representative view of the system for tuning a ribbon ion beam according to one embodiment;

DETAILED DESCRIPTION

Figure 2A:
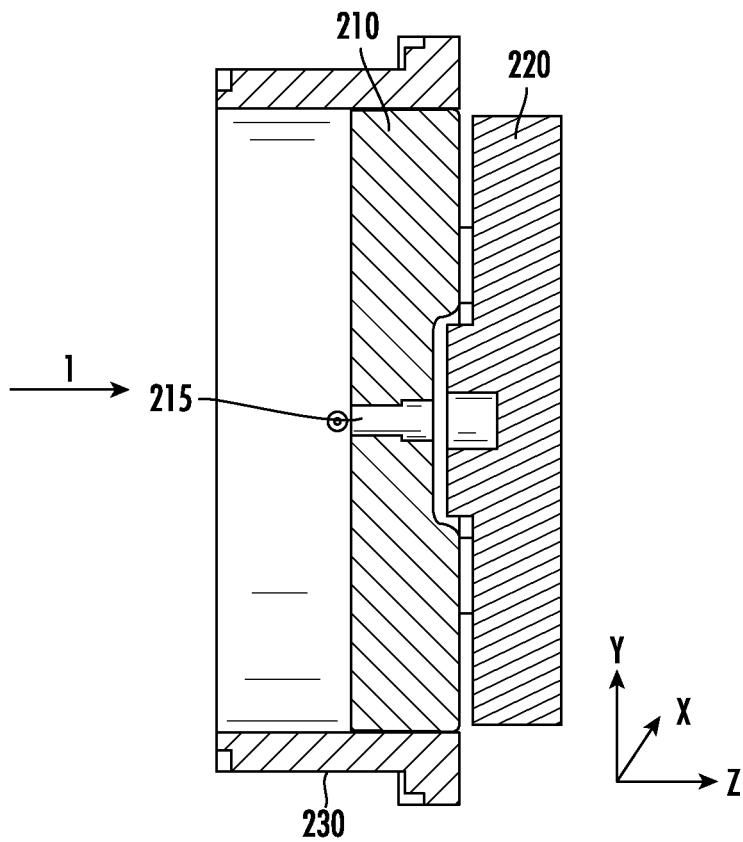
FIGS. 2A-2B show the calibration sensor according to one embodiment.

FIG. 1 shows a beam line ion implantation system that may be used for adjusting a ribbon ion beam according to one embodiment. The beam line ion implantation system may be used for processing a workpiece using a ribbon ion beam.

The beam line ion implantation system includes an ion source 100 comprising a plurality of chamber walls defining an ion source chamber. In certain embodiments, the ion source 100 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed.

In another embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 1 generated in the ion source chamber are extracted and directed toward a workpiece 10. The extraction aperture may be any suitable shape. In certain embodiments, the extraction aperture may be oval or rectangular shaped, having one dimension, referred to as the width (x-dimension), which may be much larger than the second dimension, referred to as the height (Y dimension). Throughout this disclosure, the Z direction is defined as the direction of travel of the ribbon ion beam. The X direction is defined as the wider direction of the ribbon ion beam and is perpendicular to the Z direction. The Y direction is defined as the smaller direction of the ribbon ion beam and is perpendicular to the X and Z direction.

Disposed outside and proximate the extraction aperture of the ion source 100 are extraction optics 110. In certain embodiments, the extraction optics 110 comprises one or more electrodes. Each electrode may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an electrode power supply. The electrode power supply may be used to bias one or more of the electrodes relative to the ion source so as to attract ions through the extraction aperture. The extraction aperture and the aperture in the extraction optics 110 are aligned such that the ions 1 pass through both apertures. The extraction optics 110 may be movable in the Z and Y directions, and may be controlled by optics motor 111. For example, movement in the Z direction moves the extraction optics 110 closer or farther from the ion source 100. Movement in the Y direction moves the extraction optics vertically.

Located downstream from the extraction optics 110 may be a first quadrupole lens 120. The first quadrupole lens 120 cooperates with other quadrupole lenses in the system to focus the ions 1 into a ribbon ion beam.

Located downstream from the first quadrupole lens 120 is a mass analyzer 130. The mass analyzer 130 uses magnetic fields to guide the path of the extracted ions 1. The magnetic fields affect the flight path of ions according to their mass and charge. A mass resolving device 150 that has a resolving aperture 151 is disposed at the output, or distal end, of the mass analyzer 130. By proper selection of the magnetic fields, only those ions 1 that have a selected mass and charge will be directed through the resolving aperture 151. Other ions will strike the mass resolving device 150 or a wall of the mass analyzer 130 and will not travel any further in the system.

A second quadrupole lens 140 may be disposed between the output of the mass analyzer 130 and the mass resolving device 150.

A collimator 180 is disposed downstream from the mass resolving device 150. The collimator 180 accepts the ions 1 that pass through the resolving aperture 151 and creates a ribbon ion beam formed of a plurality of parallel or nearly parallel beamlets. The output, or distal end, of the mass analyzer 130 and the input, or proximal end, of the collimator 180 may be a fixed distance apart. The mass resolving device 150 is disposed in the space between these two components.

A third quadrupole lens 160 may be disposed between the second quadrupole lens 140 and the input of the collimator 180. In some embodiments, the third quadrupole lens 160 may be disposed before the resolving aperture 151. A fourth quadrupole lens 170 may also be disposed between the mass resolving device 150 and the input of the collimator 180.

In certain embodiments, the quadrupole lenses may be disposed in other positions. For example, the third quadrupole lens 160 may be disposed between the mass resolving device 150 and the input of the collimator 180. Additionally, one or more of the quadrupole lenses may be omitted in certain embodiments.

Located downstream from the collimator 180 may be an acceleration/deceleration stage 190. The acceleration/deceleration stage 190 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF).

As the ions 1 move through the beam line ion implantation system, the path of the ions 1 is bent or otherwise altered by certain components in the system. The central trajectory of the ions as the ions travel through the beam line ion implantation system is illustrated in FIG. 1.

A calibration sensor 200 may be temporarily introduced into the path of the ions 1. For example, a calibration motor may be used to introduce the calibration sensor 200 into the path of the ions 1 during setup. The calibration motor may then remove the calibration sensor 200 when setup has been completed.

The calibration sensor 200 may be disposed in the path of the ions 1 between the mass resolving device 150 and the collimator 180. In certain embodiments, the calibration sensor 200 may be disposed in the path after the mass resolving device 150 and before the fourth quadrupole lens 170.

Since the calibration sensor 200 is introduced after the mass resolving device 150, the ions 1 may be in the shape of a small beam 2, where the height of the small beam 2 may be between about 5 to 10 mm, and the width may be between about 10 to 50 mm.

A controller 195 is also used to control the system. The controller 195 has a processing unit and an associated memory device. This memory device contains the instructions, which, when executed by the processing unit, enable the system to perform the functions described herein. This memory device may be any non-transitory storage medium, including a non-volatile memory, such as a FLASH ROM, an electrically erasable ROM or other suitable devices. In other embodiments, the memory device may be a volatile memory, such as a RAM or DRAM. In certain embodiments, the controller 195 may be a general purpose computer, an embedded processor, or a specially designed microcontroller. The actual implementation of the controller 195 is not limited by this disclosure.

The controller 195 may be in communication with each of the quadrupole lenses, the optics motor 111, the mass analyzer 130, and the calibration sensor 200.

The collimator 180 is responsible for creating a ribbon ion beam having roughly constant beam current across the region of interest (ROI), and creating substantially parallel beamlets that make up the ribbon ion beam.

Unexpectedly, it has been discovered that the position of the small beam 2 in the height direction (i.e. the Y direction) as it enters the collimator 180 and the acceleration/deceleration stage 190 affects the quality of the ribbon ion beam that impacts the workpiece 10. For example, an offset in the height direction may affect the angular spread of the ribbon ion beam, the mean angle and position, the height of the final ribbon ion beam and the amount of beam current lost in the transmission to the workpiece.

The calibration sensor 200 is configured to be capable of determining total beam current, and the provide information about the position of the small beam 2 in the height direction. Furthermore, the focus of the small beam 2 can be estimated based on the distribution of the current in the height direction. Additionally, the calibration sensor 200 may also be able to determine the height of the small beam 2. To achieve these objectives, the calibration sensor 200 is dimensioned such that it is large enough to capture all of the current of the small beam 2 and is also able to determine the position of the small beam 2 relative to the center in the height direction.

These objectives may be accomplished using a number of different configurations.

Figure 2B:
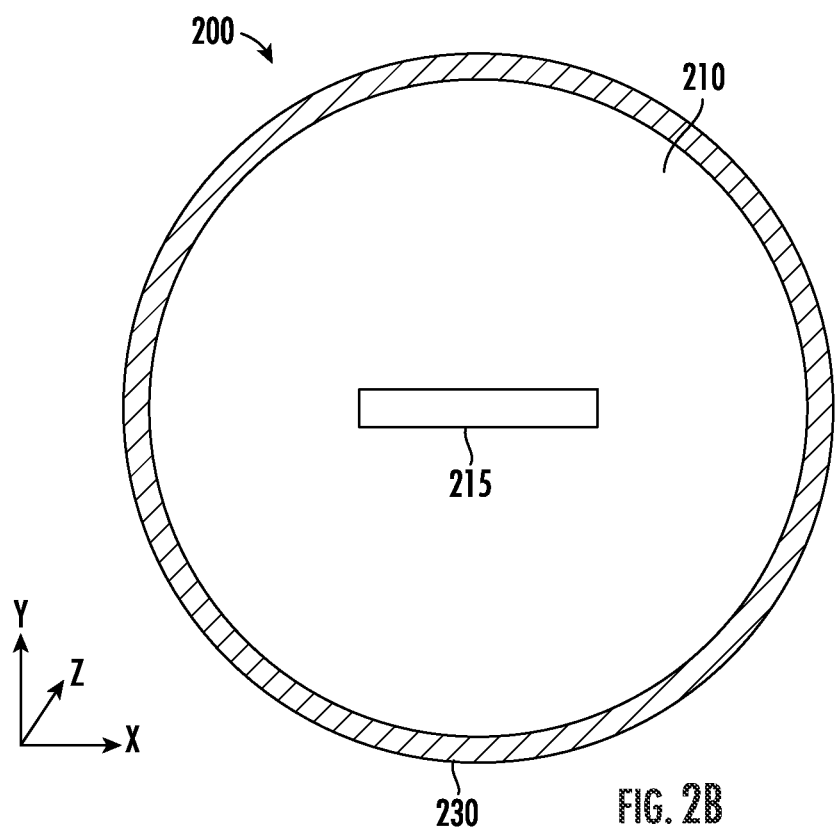

FIGS. 2A-2B show a first embodiment of the calibration sensor 200. FIG. 2A shows a cross sectional view, while FIG. 2B shows a front view of the calibration sensor 200 as seen by the ions 1. In this embodiment, the calibration sensor 200 comprises two Faraday sensors; an outer Faraday sensor 210 and an inner Faraday sensor 220. The two Faraday sensors may be contained within a cylindrical structure 230. The cylindrical structure 230 may be constructed from aluminum, graphite or another suitable material. The outer Faraday sensor 210 is configured within the cylindrical structure 230 such that ions 1 in the small beam 2 first strike or pass through the slot 215 before reaching the inner Faraday sensor 220. The outer Faraday sensor 210 may have a circular surface with a slot 215 disposed in the center of the outer Faraday sensor 210 in the height direction. The outer Faraday sensor 210 may be dimensioned to capture all of the ions in the small beam 2 that pass through the mass resolving device 150. In certain embodiments, the outer Faraday sensor 210 may have a diameter of about 6 inches, although other dimensions are also possible. The height of the slot 215 may be between 5 and 10 mm, while the width of the slot 215 may be between 25 and 50 mm. The inner Faraday sensor 220 is disposed such that ions that enter the slot 215 strike the inner Faraday sensor 220. In certain embodiments, the inner Faraday sensor is disposed behind the outer Faraday sensor 210, where "behind" is defined as downstream from the ion source along the path of the ions 1. The inner Faraday sensor 220 may be the same size as the outer Faraday sensor 210, or may be smaller. The inner Faraday sensor 220 may be separated from the outer Faraday sensor 210 using an insulating material. The outer Faraday sensor 210 and the inner Faraday sensor 220 may be cooled. This may be achieved by passing a coolant fluid, such as water, through interior channels in the sensors.

In another embodiment, the inner Faraday sensor 220 may be much smaller, so as to fit within the slot 215. In this embodiment, the inner Faraday sensor 220 may be coplanar with the outer Faraday sensor 210 or may be disposed behind the outer Faraday sensor 210.

Thus, ions 1 from the small beam 2 that are disposed in the region defined by the slot 215 impact the inner Faraday sensor 220, while all other ions 1 from the small beam 2 impact the outer Faraday sensor 210. In operation, the sum of the current collected by the outer Faraday sensor 210 and the inner Faraday sensor 220 is the total current that reaches the calibration sensor 200. Additionally, the current collected by the inner Faraday sensor 220 may be used to determine certain attributes, including height of the small beam 2, its position in the height direction and the focus of the small beam 2. For example, the ratio of the current collected by the inner Faraday sensor 220 to the total current collected by both Faraday sensors provides an indication of the percentage of ions 1 that are directed along the center line in the height direction. Alternatively, the ratio of the current collected by the inner Faraday sensor 220 to the current collected by the outer Faraday sensor 210 may also be used to provide this information. In both instances, it may be desirable to maximize this ratio. Thus, these ratios may be referred to as a vertical beam indicator, which can be used to determine height, position and focus in the Y direction.

Further, the vertical beam indicator also provides an indication of the focusing in the height direction. For example, a perfectly focused small beam may have 100% of the current collected by the inner Faraday sensor 220. Thus, a larger ratio of the current collected by the inner Faraday sensor 220 to the current collected by the outer Faraday sensor 210 implies better focusing.

Figure 3A:
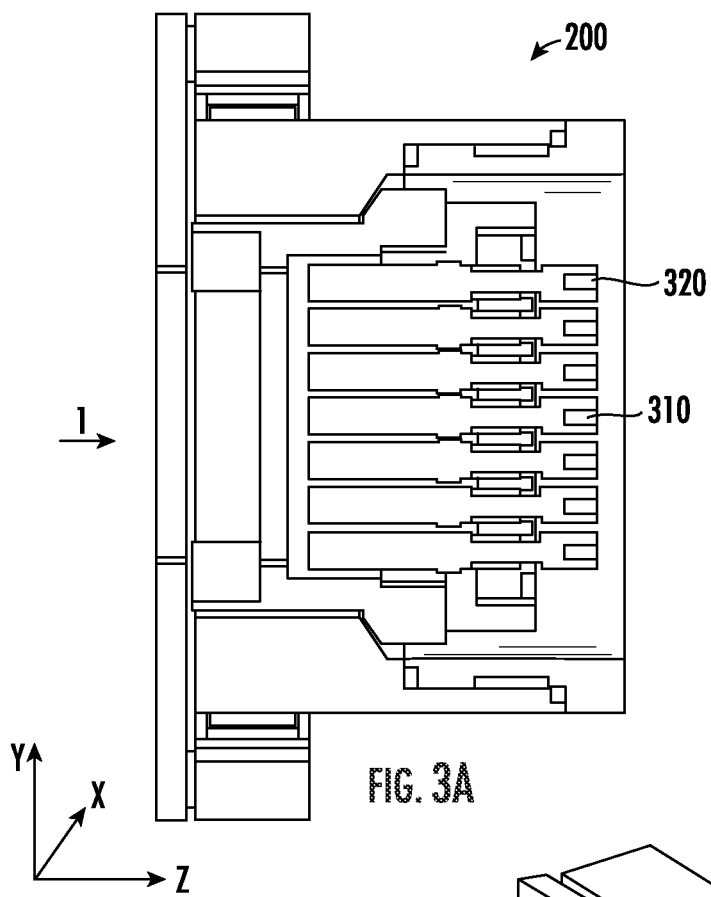
FIGS. 3A-3B show the calibration sensor according to another embodiment.
Figure 3B:
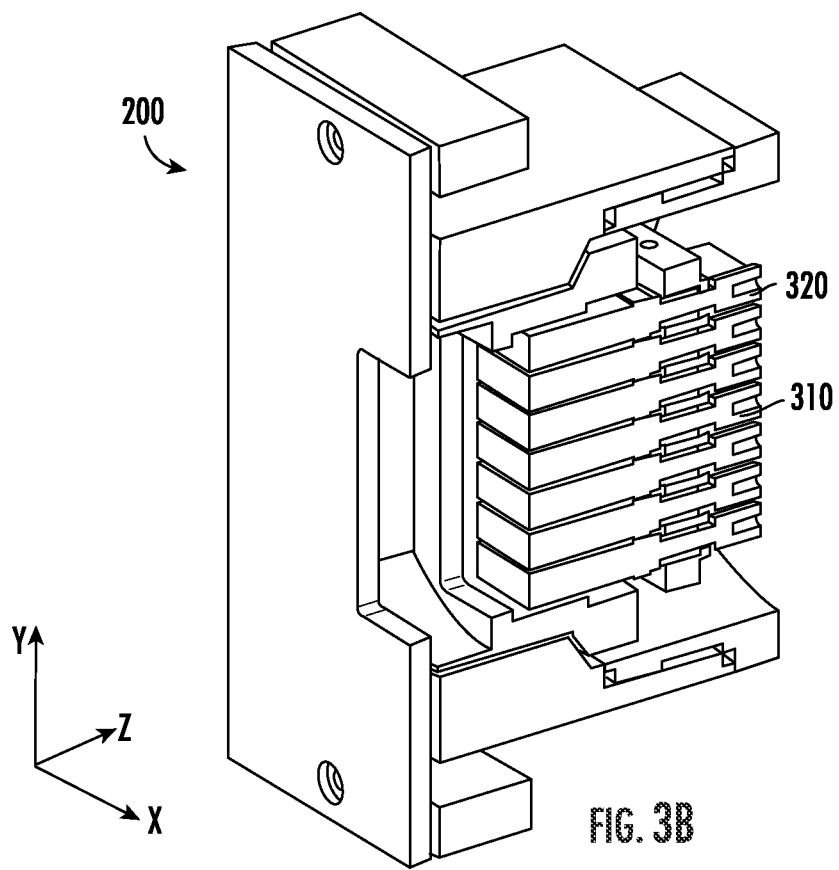

While FIGS. 2A-2B shows one embodiment of a calibration sensor 200, other embodiments are also possible. For example, FIGS. 3A-3B show a second embodiment. In this embodiment, a plurality of Faraday sensors may be stacked in the height direction. FIG. 3A shows a cross-sectional view while FIG. 3B shows a perspective view as seen by the ions 1. FIGS. 3A-3B shows seven Faraday sensors. However, other embodiments are possible. In certain embodiments, there may be at least three Faraday sensors.

In this embodiment, the calibration sensor 200 comprises a plurality of Faraday sensors stacked in the height direction, such that there is an inner Faraday sensor 310 sandwiched on each side in the height direction by one or more outer Faraday sensors 320. The Faraday sensors may be configured such that the total surface area of the Faraday sensors is sufficient to receive the entirety of the small beam 2. For example, in the case where these are seven Faraday sensors, each Faraday sensor may have a height of between about 10 and 15 mm and a width of between 50 and 100 mm. Further, in certain embodiments, the Faraday sensors may not be of equal dimension. For example, the inner Faraday sensor 310 may be thinner in the height dimension than the outer Faraday sensors 320. The Faraday sensors may be separated by an insulating material, such as alumina. The Faraday sensors may be separated from each other using an insulating material. The Faraday sensors may be cooled. This may be achieved by passing a coolant fluid, such as water, through interior channels in the sensors.

In this embodiment, the total beam current is calculated as the sum of the current collected by all of the Faraday sensors. The vertical beam indicator may be computed as the ratio of the current collected by the inner Faraday sensor 310 to the total current collected. In another embodiment, the vertical beam indicator may be computed as the ratio of the current collected by the inner Faraday sensor 310 to the current collected by all of the outer Faraday sensors 320.

Note that each calibration sensor includes an inner Faraday sensor and one or more additional outer Faraday sensors that are used to measure current. Each of these calibration sensors may be used to measure various aspects of the small beam 2, including height, vertical position and focus. Each of these attributes is described below.

One aspect of the small beam 2 that may be measured is height. This refers to the dimension of the small beam 2 in the Y direction. There are several ways that the calibration sensor may be used to measure the height of the small beam 2. In one embodiment, the height of the small beam 2 may be measured statically. In this embodiment, the calibration sensor may comprise a plurality of Faraday sensors stacked in the vertical direction, such as that shown in FIGS. 3A-3B. In this embodiment, the height of the small beam 2 may be estimated based on the current collected by each Faraday sensor in the vertical stack. For example, if the calibration sensor has seven Faraday sensors stacked in the height direction, and only five of these Faraday sensors detect any current, the height of the small beam 2 may be estimated as being equal to the height of the five Faraday sensors.

In another embodiment, the height of the small beam 2 may be measured dynamically. In this embodiment, the vertical position of the small beam 2 is intentionally varied, and the results are measured by the calibration sensor. For example, the extraction optics 110 may be moved in the Y direction. This serves to change the position of the small beam in the height direction. The extraction optics 110 may be moved sufficiently in a first direction (such as in the +Y direction) such that no ions 2 strike the inner Faraday sensor.

The extraction optics 110 may then be moved in the second direction, such as the -Y direction, by a predetermined amount. After each movement of the extraction optics 110, the current collected by the inner Faraday sensor may be measured and recorded by the controller 195. This sequence may be repeated by the controller 195 until the extraction optics 110 have been moved sufficiently far in the second direction such that no ions 2 strike the inner Faraday sensor. This sequence may be used to generate a graph, such as that shown in FIG. 4 or table that relates position of extraction optics 110 in the Y direction to current collected.

Figure 4:
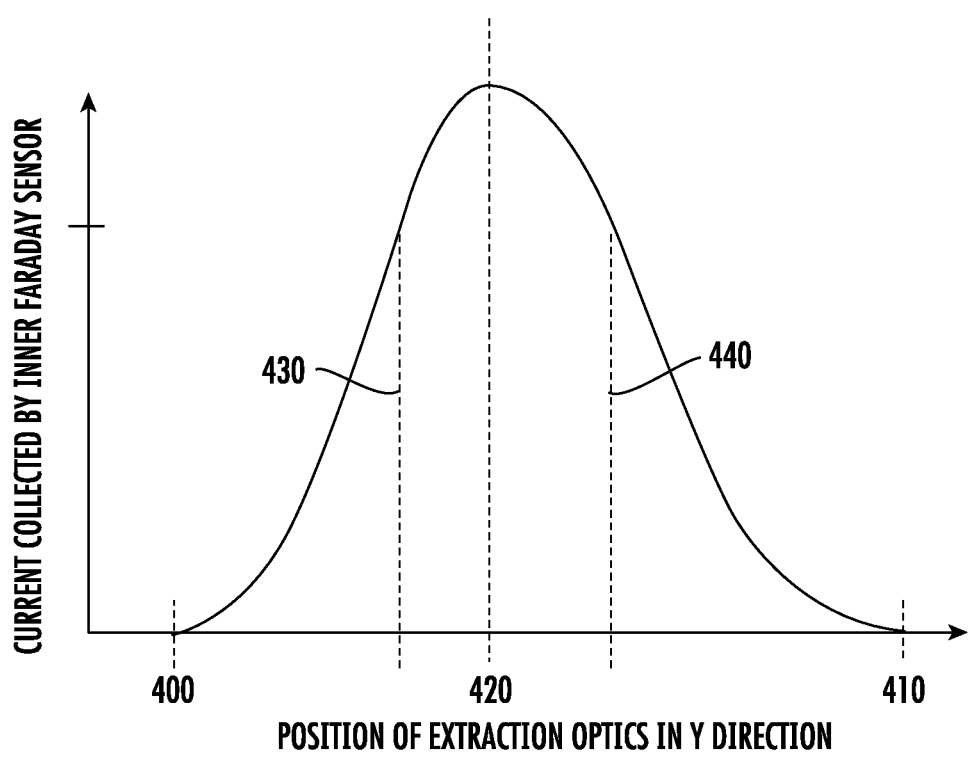
FIG. 4 shows a graph of position of extraction optics versus current.

The graph in FIG. 4 may be used to estimate the height of the small beam 2, based on the position of the extraction optics 110 at which the inner Faraday sensor detected any current. In this figure, the height of the small beam 2 can be determined based on the difference in the height direction of the extraction optics 110 between point 400 and point 410.

Note that once the height of the small beam 2 can be measured, it can be changed. For example, movement of the extraction optics 110 in the Z direction, or tuning of the first quadrupole lens 120 and/or the second quadrupole lens 140 may change the height of the small beam 2.

Note that this height measurement may not be possible using a single large Faraday sensor because the movement of the extraction optics 110 in the Y direction may be limited to a distance that is less than the size of the single large Faraday sensor.

In addition to measuring and tuning the height of the small beam 2, the calibration sensor may be used to measure and adjust the position of the small beam 2 in the Y direction.

The measurement of the position of the small beam 2 in the height direction may be done in a plurality of ways.

For example, in one embodiment, the controller 195 uses the graph shown in FIG. 4 to determine the position of the small beam 2 in the height direction. FIG. 4 shows that the peak current is detected at point 420, which corresponds to a specific position of the extraction optics 110. Thus, based on the graph shown in FIG. 4, and the current position of the extraction optics 110, the center of the small beam 2 may be determined.

In another embodiment, if the calibration sensor 200 comprises a plurality of vertically stacked Faraday sensors, such as is shown in FIGS. 3A-3B, the vertical position of the small beam 2 may be determined based on the current collected by each of the plurality of Faraday sensors. The center vertical position of the small beam 2 may be determined to be equal to the middle of the Faraday sensor that detected the higher current.

In certain embodiments, it may be useful to move the vertical position of the small beam 2 to the center of the calibration sensor 200. Again, this may be performed in a number of ways.

In one embodiment, this may be done using the graph in FIG. 4, where the extraction optics 110 are moved to the position that corresponds to point 420.

In another embodiment, the vertical position of the small beam 2 may be adjusted by moving the extraction optics 110 until the inner Faraday sensor has the largest measured current.

When using the calibration sensor shown in FIGS. 3A-3B, the extraction optics 110 may be readily moved in the direction so as to move the center of the small beam 2 toward the inner Faraday sensor 310. Specifically, if the current collected by one or more of the outer Faraday sensors 320 disposed above the inner Faraday sensor 310 in the height direction is larger than the current collected by the inner Faraday sensor 310, the controller 195 tunes the extraction optics 110 so as to move the center of the small beam 2 lower in the height direction. Conversely, if the current collected by one or more of the outer Faraday sensors 320 disposed below the inner Faraday sensor 310 in the height direction is larger than the current collected by the inner Faraday sensor 310, the controller 195 tunes the extraction optics 110 so as to move the center of the small beam 2 higher in the height direction. The controller 195 may continue tuning the components until the inner Faraday sensor detects more current than any of the outer Faraday sensors. It is appreciated that during this process, the controller 195 may also tune one or more of the first quadrupole lens 120, the mass analyzer 130, the second quadrupole lens 140, and the third quadrupole lens 160.

Figure 5:
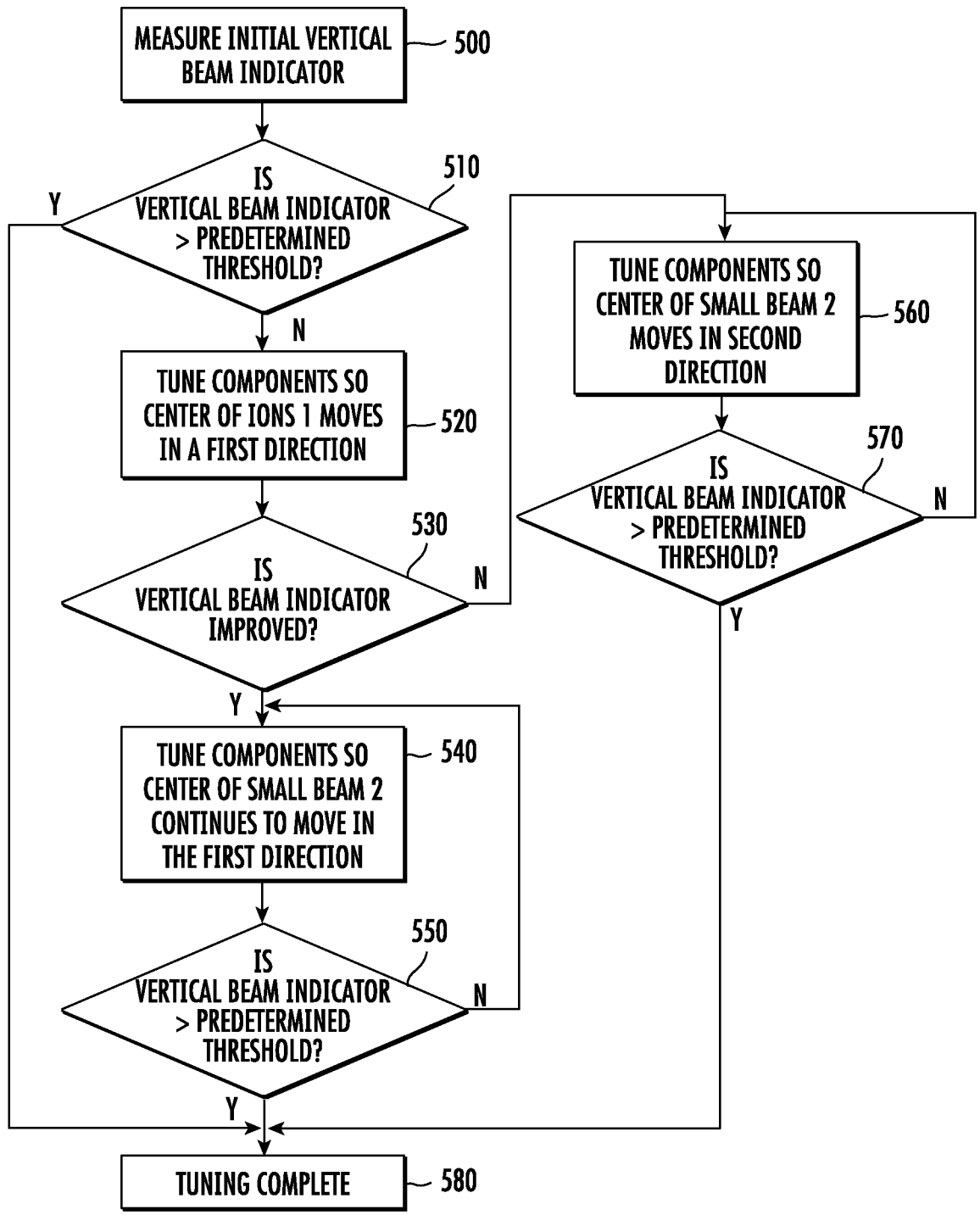
FIG. 5 shows a sequence to center the beamline in the height direction according to one embodiment.

However, when using the calibration sensor shown in FIGS. 2A-2B, centering the small beam 2 may be more complex. This is because at the beginning of the tuning process, it is unknown whether the center of the small beam 2 is above or below the slot 215. One process for centering the small beam 2 in the vertical direction for this calibration sensor is shown in FIG. 5.

First, as shown in Box 500, the vertical beam indicator may be measured. As described above, this may be the ratio of the current collected by the inner Faraday sensor 220 to the total current, or the ratio of the current collected by the inner Faraday sensor 220 to the current collected by the outer Faraday sensor 210. The controller 195 then compares this vertical beam indicator to a predetermined threshold, as shown in Box 510. If the vertical beam indicator is greater than the predetermined threshold, the tuning is complete, as shown in Box 580. For example, the predetermined threshold may be set to a value such that at least 50% of the measured current is detected by the inner Faraday sensor 220. Thus, if the vertical beam indicator is greater than this threshold, then most of the ions 2 are striking the inner Faraday sensor 220.

If, however, the vertical beam indicator is less than the predetermined threshold, the controller 195 tunes one or more of the extraction optics 110, the first quadrupole lens 120, the mass analyzer 130, the second quadrupole lens 140 and the third quadrupole lens 160 so as to cause the path of ions 1 to change in the Y direction. This change may be to move the path of the ions 1 up or down in the Y direction. This change is referred to as the first direction. Since there are only two Faraday sensors, the calibration sensor of FIGS. 2A-2B cannot determine initially which direction the path of ions 1 is to be moved to improve the height position. Thus, the controller 195 selects one of these two directions (up or down) and tunes one or more of the extraction optics 110, the first quadrupole lens 120, the mass analyzer 130, the second quadrupole lens 140 and the third quadrupole lens 160, as shown in Box 520.

After the movement, the controller 195 again measures the vertical beam indicator and compares it to the previous vertical beam indicator, as shown in Box 530. If the vertical beam indicator has improved, this indicates that more ions have passed through the slot 215. Thus, the controller 195 will continue to tune the components to move the path of the extracted ions 1 in the first direction, as shown in Box 540. The controller 195 will then check if the vertical beam indicator is greater than the predetermined threshold, as shown in Box 550. The controller 195 may repeat the processes shown in Boxes 540-550 until the vertical beam indicator exceeds the predetermined threshold.

If, however, in Box 530, the controller 195 determines that the vertical beam indicator has gotten worse, this is an indication that the path of the ions 1 are moving further from the slot 215. Thus, in this situation, as shown in Box 560, the controller 195 will tune the components so as to move the path of the ions 1 in a second direction, which is the opposite direction from the first direction. The controller then compares the vertical beam indicator to the predetermined threshold, as shown in Box 570. The controller 195 may repeat the processes shown in Boxes 560-570 until the vertical beam indicator exceeds the predetermined threshold.

Thus, the use of a calibration sensor having at least two Faraday sensors also enables the centering of the small beam 2.

It is noted that although the previous disclosures describes a process to center the small beam 2 in the height direction, in certain embodiments, it may be beneficial to have the center of the small beam 2 offset from the center of the beam line. Using the procedures described above, this can also be accomplished.

In addition to determining and moving the center of the small beam 2, the calibration sensor 200 described herein also allows for focusing of the small beam 2. Focus may be defined as the size of the small beam 2 which has a current greater than a certain value. For example, referring to FIG. 4, points 430 and 440 define the endpoints of the range where the measured current is equal to or greater than a predetermined level, such as 50% or more of the maximum value.

As the degree of focus increases, the percentage of the ions 1 that strike the inner Faraday sensor may increase. Therefore, the vertical beam indicator also increases.

Figure 6:
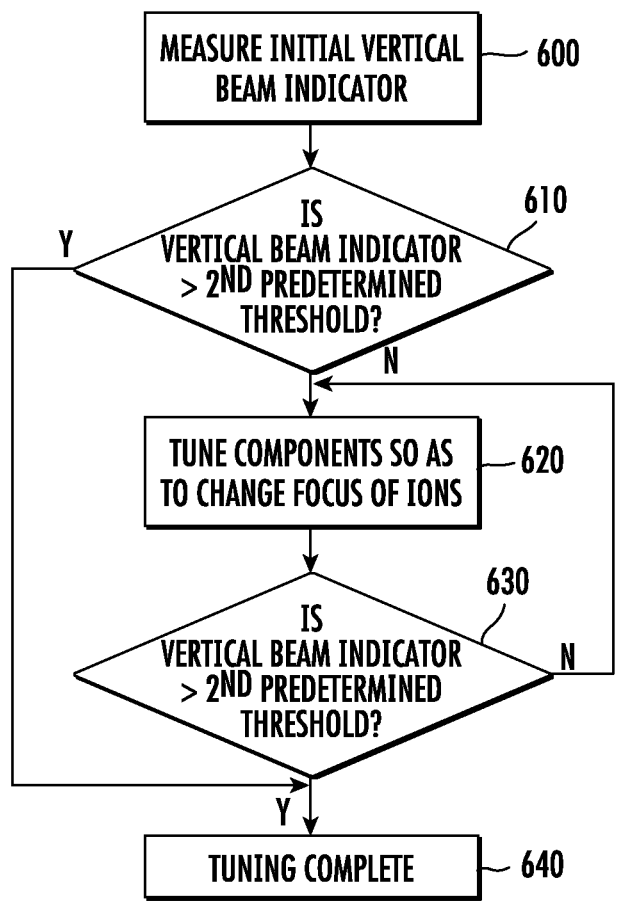
FIG. 6 shows a sequence to focus the ions in the height direction according to one embodiment.

Thus, once the small beam 2 is centered in the height direction, a second tuning process may be used to focus the ions 1. One embodiment of this tuning process is shown in FIG. 6. Note that the tuning of one or more of the extraction optics 110, the first quadrupole lens 120, the mass analyzer 130, the second quadrupole lens 140 and the third quadrupole lens 160 to focus the small beam 2 may differ as compared to how these components are tuned to move the small beam 2 in the height direction. For example, the extraction optics 110 may be moved in the Z direction for focusing and in the Y direction for centering.

First, as shown in Box 600, the vertical beam indicator may be measured. The controller 195 then compares this vertical beam indicator to a second predetermined threshold, as shown in Box 610. The second predetermined threshold may be higher than the predetermined threshold used in the sequence shown in FIG. 5. If the vertical beam indicator is greater than the second predetermined threshold, the tuning is complete, as shown in Box 640.

If, however, the vertical beam indicator is less than the second predetermined threshold, the controller 195 tunes one or more of the extraction optics 110, the first quadrupole lens 120, the mass analyzer 130, the second quadrupole lens 140 and the third quadrupole lens 160 so as to attempt focus the small beam 2 as shown in Box 620.

After the tuning, the controller 195 again measures the vertical beam indicator and compares it to the second predetermined threshold, as shown in Box 630. If the vertical beam indicator is greater than the second predetermined threshold, tuning is complete as shown in Box 640. If, however, the vertical beam indicator is less than the second predetermined threshold, the controller 195 may repeat the process shown in Box 620 until the vertical beam indicator exceeds the second predetermined threshold.

Thus, in one embodiment, the process of centering the small beam 2 in the height direction and the focusing of the small beam 2 are performed separately. These may be performed sequentially if the tuning is different for height adjustment and focusing. In this embodiment, the predetermined threshold for the height alignment indicator may be set to a first value to center the small beam 2 in the height direction. This first predetermined threshold may be used during the sequence shown in FIG. 5. This first predetermined threshold may be set so that the majority of the ions 1 impact the inner Faraday sensor 220.

Once the small beam 2 is centered in the height direction, a second tuning process may be used to focus the ions 1. This tuning process is shown in FIG. 6, where a second predetermined threshold is used. This second predetermined threshold may be greater than the first predetermined threshold in certain embodiments. Note that the tuning of one or more of the extraction optics 110, the first quadrupole lens 120, the mass analyzer 130, the second quadrupole lens 140 and the third quadrupole lens 160 to focus the small beam 2 may differ as compared to how these components are tuned to move the small beam 2 in the height direction. For example, the extraction optics 110 may be moved in the Y direction to center the ions 1 in the height direction, and then moved in the Z direction to adjust the focus of the ions.

In another embodiment, the sequence shown in FIG. 5 may be used to simultaneously center the ions 1 and also focus the ions 1. This may be done by selecting a high determined threshold value.

Thus, by using the information provided by the calibration sensor 200, the controller 195 may determine the vertical height of the small beam 2, maximize its beam current and also adjust the position and focus of the small beam 2 in the height direction.

In both embodiments, the calibration sensor 200 is capable of measuring total current as well as providing information about the position of the ions 1 in the height direction. In one embodiment, this is achieved using an outer Faraday sensor 210 with a slot 215 in its center, wherein the inner Faraday sensor 220 receives ions that pass through the slot 215. In another embodiment, this is achieved by at least 3 Faraday sensors stacked in the height direction, wherein there is at least one outer Faraday sensor 320 on top and bottom of the inner Faraday sensor 310.

The system and method described herein have many advantages. Current beam line systems are able to measure the total current at or near the mass resolving device. However, this information does not allow the controller 195 to adjust the components to ensure that the ions are directed along the centerline in the height direction. Thus, any deviation in the height direction is not detected until the end station, where a beam profiler may detect an offset in the height direction. However, correcting this offset using feedback from the beam profiler located in the end station may be difficult, as any height deviations are amplified by the collimator 180 and the acceleration/deceleration stage 190. By measuring these quantities near the mass resolving device 150, the tuning process may be simplified, as effects caused by the collimator 180 and acceleration/deceleration stage 190 do not affect the calibration sensor. Further, the calibration sensor described herein also allows focusing of the ions.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A beamline ion implantation system, comprising:
an ion source to generate ions;
extraction optics disposed proximate the ion source to extract the ions from the ion source;
a mass analyzer to receive the ions from the ion source;
a mass resolving device disposed after an output of the mass analyzer;
a collimator disposed after the mass resolving device; and
a calibration sensor, that is introduced into a path of the ions after the mass resolving device and before the collimator, wherein the calibration sensor comprises two or more Faraday sensors arranged in a height direction, and a current collected by each of the two or more Faraday sensors is used to provide information about a total current and a position of the ions in the height direction, wherein the beamline ion implantation system is tuned based on the position of the ions in the height direction.

2. The beamline ion implantation system of claim 1, wherein the calibration sensor provides information about a focus of the ions in the height direction.

3. The beamline ion implantation system of claim 1, wherein the calibration sensor provides information about a height of the ions.

4. The beamline ion implantation system of claim 1, further comprising a controller wherein the controller tunes at least one of the extraction optics and the mass analyzer based on information regarding the position of the ions in the height direction from the calibration sensor.

5. The beamline ion implantation system of claim 4, further comprising at least one quadrupole lens disposed between the ion source and the mass resolving device, wherein the controller tunes the at least one quadrupole lens based on information regarding the position of the ions in the height direction from the calibration sensor.

6. The beamline ion implantation system of claim 1, wherein the calibration sensor comprises an outer Faraday sensor having a slot in a center in the height direction and an inner Faraday sensor disposed behind the slot.

7. The beamline ion implantation system of claim 6, wherein the information about the position of the ions in the height direction comprises a ratio of current collected by the inner Faraday sensor to the total current collected by the calibration sensor.

8. The beamline ion implantation system of claim 1, wherein the calibration sensor comprises a plurality of Faraday sensors stacked in the height direction, wherein an inner Faraday sensor is sandwiched between at least one outer Faraday sensor on each side in the height direction.

9. The beamline ion implantation system of claim 8, wherein the information about the position of the ions in the height direction comprises a ratio of current collected by the inner Faraday sensor to the total current collected by the calibration sensor.

10. A beamline ion implantation system, comprising:
an ion source to generate ions;
extraction optics disposed proximate the ion source to extract the ions from the ion source;
a mass analyzer to receive the ions from the ion source;
a mass resolving device disposed after an output of the mass analyzer to create a small beam;
a collimator disposed after the mass resolving device to receive the small beam and create an ion beam that impacts a workpiece;
a calibration sensor, that is introduced into a path of the ions after the mass resolving device and before the collimator, wherein the calibration sensor comprises two or more Faraday sensors arranged in a height direction, and a current collected by each of the two or more Faraday sensors is used to provide information about a total current and a position of the small beam in a height direction; and
a controller, wherein the controller is configured to determine one or more characteristics of the small beam based on the information from the calibration sensor, where the one or more characteristics comprise a height of the small beam, the position of the small beam in the height direction and a focus of the small beam and is configured to tune the beam line ion implantation system based on at least one of the one or more characteristics.

11. The beamline ion implantation system of claim 10, wherein the calibration sensor comprises an outer Faraday sensor having a slot in a center in the height direction and an inner Faraday sensor disposed behind the slot.

12. The beamline ion implantation system of claim 11, wherein the controller determines the height of the small beam by moving the extraction optics so that the small beam moves in the height direction, and wherein the height is determined based on positions of the extraction optics at which the inner Faraday sensor collects current.

13. The beamline ion implantation system of claim 11, wherein the controller determines the focus of the ions in the height direction using a ratio of current collected by the inner Faraday sensor to the total current collected by the calibration sensor.

14. The beamline ion implantation system of claim 10, wherein the calibration sensor comprises a plurality of Faraday sensors stacked in the height direction, wherein an inner Faraday sensor is sandwiched between at least one outer Faraday sensor on each side in the height direction.

15. The beamline ion implantation system of claim 14, wherein the controller determines the height of the small beam based on which Faraday sensors collect current.

16. The beamline ion implantation system of claim 14, wherein the controller determines the position of the small beam in the height direction based on which Faraday sensor collect a maximum amount of current.

17. The beamline ion implantation system of claim 14, wherein the controller determines the focus of the small beam in the height direction based on a ratio of current collected by the inner Faraday sensor to the total current collected by the calibration sensor.

18. The beamline ion implantation system of claim 10, wherein the controller tunes at least one of the extraction optics and the mass analyzer based on information regarding the position of the ions in the height direction from the calibration sensor.

\* \* \* \* \*